United States Patent [19]

Moyal et al.

[11] Patent Number: 5,136,183

[45] Date of Patent: Aug. 4, 1992

[54] INTEGRATED COMPARATOR CIRCUIT

[75] Inventors: Miki Moyal; Russ Apfel, both of Austin, Tex.

[73] Assignee: Advanced Micro Devices, Inc., Sunnyvale, Calif.

[21] Appl. No.: 544,737

[22] Filed: Jun. 27, 1990

[51] Int. Cl.[5] ........................ H03K 5/24; H03K 5/153
[52] U.S. Cl. .................................. 307/355; 307/473; 307/494; 307/491
[58] Field of Search ............... 307/355, 473, 491, 494, 307/264, 362

[56] References Cited

U.S. PATENT DOCUMENTS

| 4,166,964 | 9/1979 | Ahmed | 307/296.6 |
| 4,346,312 | 8/1982 | Christopherson | 307/455 |
| 4,514,651 | 4/1985 | Miller et al. | 307/264 |
| 4,751,405 | 6/1988 | Bufano, Jr. et al. | 307/355 |
| 4,795,918 | 1/1989 | Menon et al. | 307/296.6 |
| 4,841,171 | 6/1989 | Dong-Il | 307/355 |

Primary Examiner—John Zazworsky
Attorney, Agent, or Firm—Foley & Lardner

[57] ABSTRACT

There is disclosed a three-state buffer including a comparator circuit which comprises a plurality of bipolar transistors and which generates first and second control voltages which are dependent upon the forward biased base to emitter voltage drops of the transistors. The comparator circuit also includes a threshold circuit establishing a threshold voltage intermediate the first and second control voltages which is also dependent upon the forward biased base to emitter voltage drops of the transistors. As a result, the threshold voltage is always intermediate the first and second control voltages to assure reliable operation of the comparator circuit notwithstanding variations in integrated circuit processing parameters or integrated circuit operating temperatures.

8 Claims, 2 Drawing Sheets

INTEGRATED COMPARATOR CIRCUIT

BACKGROUND OF THE INVENTION

The present invention generally relates to an integrated circuit. The present invention more particularly relates to a comparator circuit for use in an integrated circuit which includes a voltage threshold stage for establishing a threshold voltage and a voltage level generator for providing a voltage which is always sufficient to overcome the threshold voltage. The invention still more particularly relates to such a comparator circuit wherein the voltage level generator provides first and second control voltages, the first control voltage greater than the threshold voltage and the second control voltage less than the voltage threshold. The voltage level generator and threshold stage are arranged to insure that the threshold voltage remains intermediate the first and second control voltages levels notwithstanding variations in integrated circuit processing parameters or integrated circuit operating temperatures.

Voltage comparator circuits for determining which of two voltages is greater are well known in the art and find many applications. Such circuits find considerable use in integrated circuits either alone or in other forms of circuits such as three-state buffers. Three-state buffers are circuits which provide a first output, such as a logical one, when a first input voltage is greater than a second input voltage, and a second output, such as a logical zero, when the second input voltage is greater than the first input voltage. Such circuits generally include an enable input which causes the buffer output to be disconnected from other circuits in response to a disable voltage being applied to the enable input.

In one implementation of such a three-state buffer, the comparator portion includes a threshold circuit which establishes a threshold voltage and a voltage generator which provides first and second control voltages. The threshold voltage is intermediate the first and second control voltages which are applied to a pair of threshold stage inputs in response to the input voltages. The threshold circuit controls the comparator output to be a logical one or zero depending upon which threshold input receives the first control voltage and which threshold circuit input receives the second control voltage. In order for the comparator to perform its function reliably, it is necessary that the threshold voltage remain intermediate the first and second control voltages.

Unfortunately, in the past, integrated circuit processing parameters and integrated circuit operating temperatures have had a strong influence upon whether or not the threshold voltage remained intermediate the first and second control voltages. This resulted because the threshold circuits and voltage generators were configured so that the threshold voltages were permitted to vary independently of the first and second control voltages as a result of varying integrated circuit processing parameters and integrated circuit operating temperatures. As a result, under certain processing or temperature conditions, a threshold voltage became greater than either the first or second voltage levels and, under other such conditions, the threshold voltage became less than either the first or second voltage levels. In either condition, the comparator circuit does not function properly.

The present invention overcomes the aforementioned problems associated with prior art comparator circuits by providing a threshold stage and a voltage level generator that provides a threshold voltage and the first and second control voltages which vary in the same direction and amount in response to variations in integrated circuit processing parameters or integrated circuit operating temperatures. As will be seen hereinafter, this is accomplished by forming these circuits from bipolar transistors which are forward biased in operation, and wherein the forward biased base to emitter voltage drops of these devices are used to advantage to derive the threshold voltage and the first and second control voltages. As a result, the threshold voltage and the first and second control voltages are all dependent upon the forward biased base to emitter voltage drops of the devices so that the threshold voltage will always remain intermediate the first and second control voltages under varying processing or operating temperature conditions.

SUMMARY OF THE INVENTION

The invention therefore provides an integrated circuit of the type including a plurality of bipolar transistors including a collector, a base, and an emitter, a threshold circuit for deriving a voltage threshold and a voltage supply for supplying a voltage which is always sufficient to overcome the threshold voltage. The integrated circuit includes threshold setting means including a first plurality of the bipolar transistors for establishing a voltage threshold equal to a first number of forward biased base to emitter voltage drops plus a first incremental voltage, and control voltage supply means for providing a first control voltage equal to a second number of forward biased base to emitter voltage drops plus a second incremental voltage wherein the first control voltage is greater than the threshold voltage. As a result, the power supply means is arranged to always provide a control voltage sufficient to overcome the threshold voltage notwithstanding integrated circuit process variations or operating temperature variations which vary, in equal amounts, the forward biased base to emitter voltage drops of each of the transistors.

The present invention further provides a comparator circuit for use in an integrated circuit for reliably determining which one of two voltages is greater in potential notwithstanding variations in integrated circuit processing parameters or operating temperatures. The comparator circuit includes first and second inputs for receiving the voltages to be compared and voltage generating means for providing a supply voltage. The comparator circuit further includes control voltage generating means coupled to the first and second inputs and to the voltage generating means and includes first and second outputs for deriving from the supply voltage a first control voltage at the first output and a second control voltage at the second output when the voltage at the first input is greater than the voltage at the second input and the first control voltage at the second output and the second control voltage at the first output when the voltage at the first input is less than the voltage at the second input. The first control voltage and the second control voltage differ by a substantially fixed potential difference. The comparator circuit further includes threshold setting means for establishing a threshold voltage intermediate the first and second control voltages, and output means responsive to voltage responsive to the control voltages and the threshold voltage for providing a first output voltage responsive to the first control voltage being at the first output and the second control voltage being at the second output and a second output voltage responsive to the first control voltage being at the second output and the second control voltage being at the first output. The voltage generating means and the control voltage generating means are arranged to vary the first and second control voltages by substantially the same amount as the threshold setting means varies the threshold voltage in response to variations in integrated circuit processing parameters or operating temperatures to reliably maintain the threshold voltage intermediate the first and second voltages.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DECRIPTION OF THE PREFERRED EMBODIMENT

Figure 1:
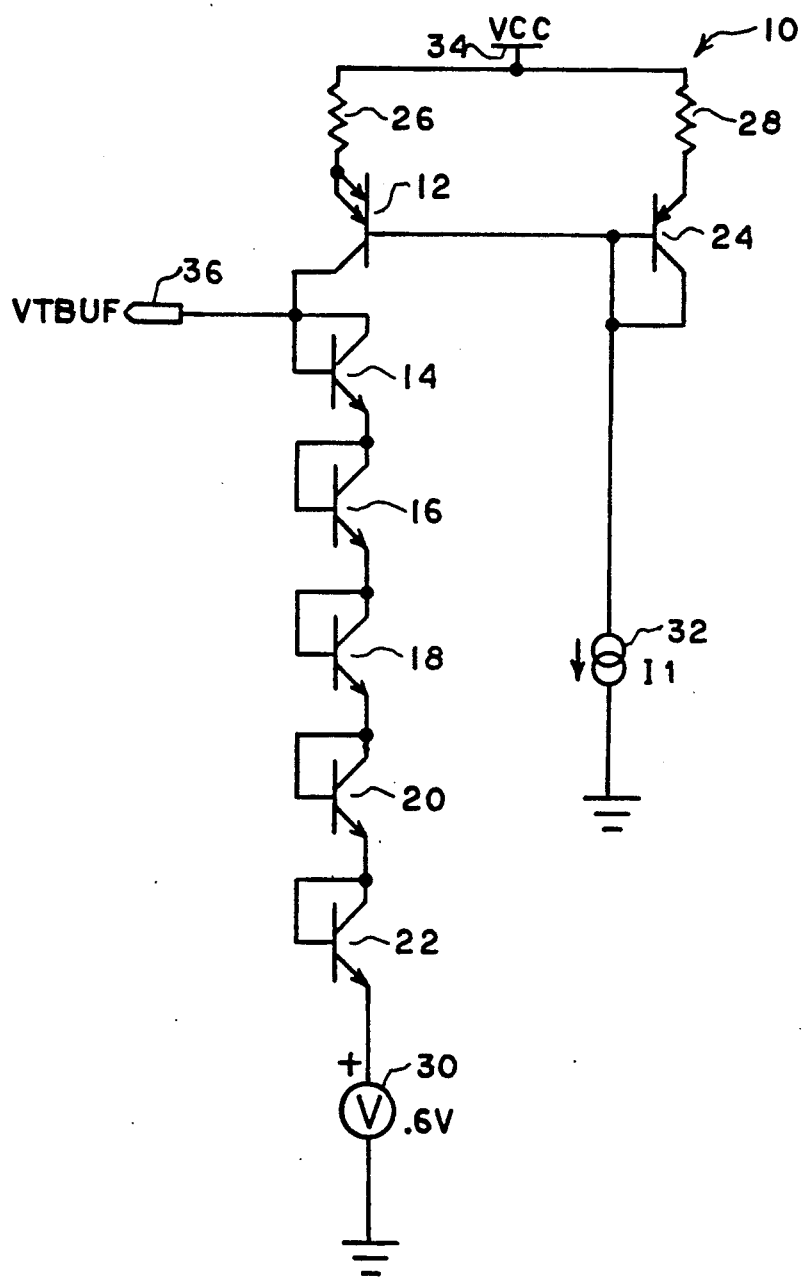
FIG. 1 is a schematic circuit diagram of a power supply voltage generator embodying one aspect of the present invention.

Referring now to FIG. 1, it illustrates, in schematic circuit diagram form, the power supply voltage generator 10 embodying the present invention. The power supply 10 generally includes a plurality of bipolar transistors 12, 14, 16, 18, 20, 22, and 24, a pair of resistors 26 and 28, a voltage source 30, and a current source 32.

Transistor 12 includes a dual emitter which is coupled to a resistor 26 which is in turn coupled to a power supply terminal 34 which may provide a power supply voltage of, for example, five volts. The collector of transistor 12 is coupled to the base of transistor 14. The base of transistor 14 is also coupled to its collector. As can be noted in the Figure, each of the transistors, 14, 16, 18, 20 and 22 are coupled in series relation to form a diode connection with the base of each of these transistors being coupled to its respective collector. The emitter of transistor 22 is coupled to the voltage source 30 which is in turn coupled to ground potential. As indicated in the Figure, the voltage source 30 provides a voltage which is equal to about 0.6 volts.

The emitter of transistor 24 is coupled to the power supply terminal 34 through a resistor 28. The bases of transistors 12 and 24 are coupled together and the collector of transistor 24 is coupled to its base. The base and collector of transistor 24 are coupled to the current source 32 which is in turn coupled to ground potential.

During the operation of the power supply voltage generator 10, the current source 32 maintains the transistors 12 and 24 in a conducting state. As a result, transistors 14, 16, 18 20 and 22 are all conducting. Because the collector and base of each of transistors 14, 16, 18, 20 and 22 are coupled together, each of these transistors will have a forward biased base to emitter voltage ($V_{BE}$) across their base and emitters. AS a result, power supply voltage generator 10 provides at its output 36 a voltage which is equal to the sum of the forward biased base to emitter voltages of transistors 14, 16, 18, 20 and 22 plus the voltage of the voltage source 30. Hence, the output voltage at terminal 36, herein referred to as a first supply voltage, is equal to five forward biased base to emitter voltages plus a second incremental voltage of 0.6 volts or 5 $V_{BE}$ plus 0.6 volts. Since the forward biased base to emitter voltage of a bipolar transistor is on the order of 0.7 volts, the voltage at terminal 34 is thus greater than the output voltage at the terminal 36. As will be seen hereinafter, the first supply voltage provided by the power supply voltage generator 10 at output 36 is sufficient to overcome a threshold voltage established by the three-state buffer of FIG. 2.

Figure 2:
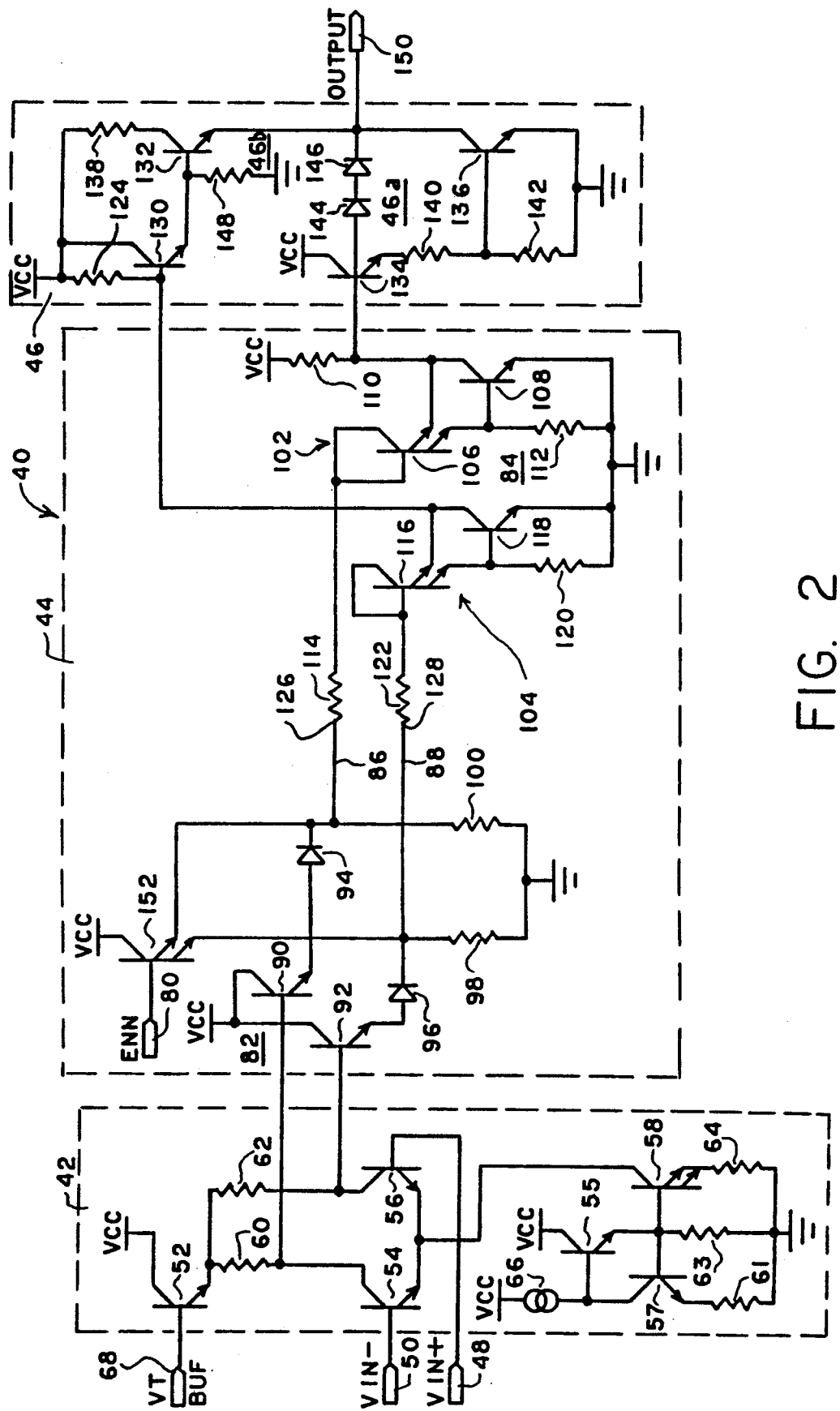
FIG. 2 is a schematic circuit diagram of a three-state buffer employing a comparator circuit embodying the present invention and which is adapted to receive the supply voltage provided by the voltage generator of FIG. 1.

Referring now to FIG. 2, it illustrates, in schematic circuit diagram form, a three-state buffer 40 embodying the present invention. The three-state buffer 40 generally includes a differential input stage 42, a level shifter and threshold stage 44, and an output stage 46.

The differential input stage 42 includes a first input 48, a second input 50, bipolar transistors 52, 54, 55, 56, 57 and 58, a plurality of resistors 60, 61, 62, 63 and 64, and a current source 66. The inputs 48 and 50 are adapted to be coupled to a pair of voltages to be compared to determine which of the two voltages is greater. As will be seen hereinafter, when the voltage at input 48 is greater than the voltage at input 50, the three-state buffer 40 provides at its output 150 a first output in the form of a logical one. When the voltage at input 50 is greater than the voltage at input 48, the three-state buffer 40 will provide at its output 150 a second output in the form of a logical zero. As will also be seen hereinafter, the three-state buffer includes an enable input 80 to cause the output of the three-state buffer to be isolated from the output stage 46 when a disable voltage is applied to the enable input 80. The disable voltage causes the output stage 46 to be isolated from the output of the three-state buffer by pulling the bases of transistors 130 and 134 low and does so regardless of the input conditions at inputs 48 and 50.

The collector of transistor 52 is coupled to the power source (VCC) which may be five volts. The base of transistor 52 is coupled to an input terminal 68 which is to be coupled to the output 36 of the power supply voltage generator 10 of FIG. 1. The emitter of transistor 52 is coupled to the collector of transistor 54 through a resistor 60 and to the collector of transistor 56 through a resistor 62. The base of transistor 54 is coupled to the second input 50 and the base of transistor 56 is coupled to the first input 48.

Transistors 55, 57 and 58, resistors 61, 63 and 64, and current source 66 of the differential input stage 42 from a constant voltage source to provide a constant voltage of 0.8 volts at the collector of transistor 58. The emitters of transistors 54 and 56 are coupled together and to the collector of transistor 58. The dual emitters of transistor 58 are coupled to ground potential through the resistor 64. The current source 66 is coupled between the power source (VCC) and a common junction formed by the base of transistor 55 and the collector of transistor 57. The collector of transistor 55 is coupled to the power source (VCC) and its emitter is coupled to the bases of transistors 57 and 58. The bases of transistors 57 and 58 are also coupled to ground potential through resistor 63. Lastly, the emitter of transistor 57 is coupled to ground potential through the resistor 61.

As one skilled in the art will appreciate, the current source 66 may be formed by utilizing the band gap voltage of the material from which the integrated circuit is formed. In accordance with this preferred embodiment, the integrated circuit is preferably formed of silicon providing a band gap volts of 1.25 voltage. A resistance $R_{cs}$ (not shown) may be placed in series with band gap voltage in a conventional manner to produce the desired current magnitude of current source 66.

The purpose of the constant voltage source is to provide a constant voltage swing of 0.8 volts at the collector of transistor 54 or the collector of transistor 56 when these transistors are turned on. To provide a constant voltage swing of 0.8 volts, the value of resistors 60 and 62 must be equal to 0.32 $R_{cs}$. This results because the current source 66 provides a current equal to the band gap voltage of 1.25 volts divided by the value of $R_{cs}$ and dual emitters of transistors 58 cause twice this current to flow through the resistors 60 and 62 when the respective transistors 54 and 56 are conducting.

The transistors 54 and 56 form the differential input of the three-state buffer 40 and, as a result, either transistor 54 or 56 will be conducting depending upon which of the first and second inputs 48 and 50 is receiving the greater voltage. For example, if the voltage at the first input 48 is greater than the voltage at the second input 50, transistor 56 will be conducting and transistor 54 will be off. Since transistor 54 is off, its collector will be at a voltage equal to four forward biased base to emitter voltage drops plus 0.6 volts. This obtains since the voltage at the base of transistor 52 is equal to the output voltage of the power supply voltage generator 10 of FIG. 1 which is equal to five forward biased base to emitter voltages plus 0.6 volts.

If transistor 56 is conducting, the voltage at the collector of transistor 56 will be equal to four forward biased base to emitter voltage drops ($V_{BE}$) plus 0.6 volts and minus the drop across resistor 62 which is 0.8 volts (4 $V_{BE}$+0.6 V−0.8 V). As a result, the collector of transistor 54 will have a voltage equal to 4 $V_{BE}$ plus 0.6 volts and the voltage at the collector of transistor 56 will have a voltage equal to 4 $V_{BE}$ minus 0.2 volts. The greater of these two voltages is referred to herein as a first level supply voltage and the lesser of these two voltages is referred to herein as a second level supply voltage. As will be seen hereinafter, the first level supply voltage is used to derive a first control voltage which is greater than the threshold voltage established by stage 44 and the second level supply voltage is used to derive a second control voltage which is less than the threshold voltage established by stage 44.

As can be seen from the foregoing, the differential input stage 42 applies either the first level supply voltage to one of the collectors of transistors 54 or 56 and the second level supply voltage to the collector of the other transistor 54 or 56 responsive to the voltages to be compared at the inputs 48 and 50. When the voltage at input 48 is greater than the voltage at input 50, the collector of transistor 54 will be at the first level and the collector of transistor 56 will be at the second level. Conversely, when the voltage at input 50 is greater than the voltage at input 48, the collector of transistor 56 will be at the first level and the collector of transistor 54 will be at the second level.

The voltage shifting and threshold stage 44 generally includes a voltage shifting circuit 82 and a threshold circuit 84. The voltage shifting circuit 82 is arranged to shift the first and second voltage levels provided at the collectors of transistors 54 and 56 to first and second control voltages respectively and apply the first and second control voltages to a first output 86 and a second output 88.

The voltage shifting circuit 82 includes bipolar transistors 90 and 92, diodes 94 and 96, and resistors 98 and 100. The collectors of transistors 90 and 92 are coupled to a power source (VCC) which may be five volts. The base of transistor 90 is coupled to the collector of transistor 54 and the base of transistor 92 is coupled to the collector of transistor 56. The emitter of transistor 90 is coupled to the first output through the diode 94 and the emitter of transistor 92 is coupled to the second output 88 through the diode 96. The cathodes of diodes 94 and 96 are coupled to ground through resistors 100 and 98 respectively.

As can be seen in the Figure, transistor 90 and diode 94 are arranged to shift, in a downward direction the voltage at the collector of transistor 54 by an amount equal to two forward biased base to emitter voltage drops. Similarly, transistor 92 and diode 96 are arranged to shift the voltage at the collector of transistor 56 in a downward direction by an amount also equal to two forward biased base to emitter voltage drops. Hence, the first level supply voltage of 4 $V_{BE}$ plus 6 volts is shifted to 2 $V_{BE}$ plus 0.6 volts to derive a first control voltage and the second level voltage supply of 4 $V_{BE}$ minus 0.2 volts is shifted to 2 $V_{BE}$ minus a third incremental voltage of 0.2 volts to derive a second control voltage. As a result, when the voltage at input 48 is greater than the voltage at input 50, the first control voltage will be at output 86 and the second control voltage will be at output 88. When the voltage at input 50 is greater than voltage at input 48, the first control voltage will be at output 88 and the second control voltage will be at output 86. As will be seen hereinafter, the first control voltage is greater than the threshold voltage established by threshold circuit 84 and the second control voltage is less than the threshold voltage established by the threshold circuit 84.

The threshold circuit 84 generally includes a first threshold circuit 102 and a second threshold circuit 104. The first threshold circuit 102 includes an input 126, bipolar transistors 106 and 108 and resistors 110, 112 and 114. The second threshold circuit 104 includes an input 128, bipolar transistors 116 and 118 and resistors 120 and 122.

The base and collector of transistor 106 are coupled together and to the first output 86 of the level shifter 82 at input 126 by a resistor 114. Similarly, the base and collector of transistor 116 are coupled together and to the second output 88 of the level shifter 82 at input 128 by resistor 122. Transistor 106 includes a dual emitter with one emitter being coupled to power source (VCC) through resistor 110 and to the collector of transistor 108. The other emitter of transistor 106 is coupled to the base of transistor 108 and to ground through resistor 112. The emitter of transistor 108 is coupled directly to ground potential.

Transistor 116 is also a dual emitter transistor with one emitter coupled to the collector of transistor 118 and to the power source (VCC) through a resistor 124 of output stage 46. The other emitter of transistor 116 is coupled to the base of transistor 118 and to ground potential through the resistor 120. The emitter of transistor 118 is coupled directly to ground potential. Preferably, and in accordance with this preferred embodiment, the resistance of resistors 112 and 120 is five times the resistance of resistors 114 and 122. As a result, the threshold circuits 102 and 104 each establish a threshold voltage of two forward biased base to emitter voltage drops plus a first incremental voltage of two-tenths of a forward biased base to emitter voltage drop (2 $V_{BE}+0.2\,V_{BE}$). As a result, the threshold voltage established by the threshold circuit 84 is intermediate the first control voltage of 2 $V_{BE}$ plus 0.6 volts and the second control voltage of $2V_{BE}$ minus 0.2 volts.

The input 126 comprises the first input to the threshold circuit 84 and the input 128 comprises the second input of the threshold circuit 84. When the first control voltage is at input 126, the second control voltage will be at input 128. In this condition, transistors 106 and 108 will be conducting and transistors 116 and 118 will be off. Conversely, if the first control voltage is at input 128 and the second control voltage is at input 126, transistors 106 and 108 will be off and transistors 116 and 118 will be conducting.

The output stage 46 generally includes a series coupled first output circuit 46a and second output circuit 46b including bipolar transistors 130, 132, 134 and 136, resistors 124, 138, 140 and 142, and diodes 144 and 146. The output stage 46 includes the output terminal 150 which is coupled to the common junction of circuit 46a and 46b and which comprises the output of the three-state buffer 40.

With respect to the first output circuit 46a, the collector of transistor 134 is coupled directly to the power source (VCC). The base of transistor 134 is coupled to the collector of transistor 108 and to the output terminal 150 through diodes 144 and 146. The emitter of transistor 134 is coupled to the base of transistor 136 through the resistor 140. The base of transistor 136 is coupled to ground potential through resistor 142. The emitter of transistor 136 is coupled directly to ground and its collector is coupled to the output terminal 150.

With respect to the second output circuit 46b, the collector of transistor 130 is coupled directly to the power source (VCC) and the collector of transistor 132 is also coupled to the power source through a resistor 138. The base of transistor 130 is coupled to the resistor 124 and to the collector of transistor 118. The emitter of transistor 130 is coupled to ground potential through resistor 148 and to the base of transistor 132. The emitter of transistor 132 is coupled to the output terminal 150.

When the first control voltage is at input 126, transistors 106 and 108 will be conducting. When transistors 106 and 108 conduct, transistors 134 and 136 will be turned off. This provides a high impedance path between output 150 and ground potential. Also, when the first control voltage appears at input 126, the second control voltage will appear at input 128 to cause transistors 116 and 118 to be off. This permits resistor 124 to pull the base of transistor 130 high to turn transistors 130 and 132 on and to permit the output terminal 150 to be coupled to a high voltage level equal to about four volts.

When the input 126 receives the second control voltage, transistors 106 and 108 will be turned off to cause transistors 134 and 136 to conduct. This provides a low impedance path between output terminal 150 and ground potential. When the second control voltage appears at the first input 126, the first control voltage appears input 128. This causes transistors 116 and 118 to conduct to turn transistors 130 and 132 off. With transistors 130 and 132 turned off, and transistor 136 conducting, the output terminal 150 will be at a logical zero and a voltage on the order of 0.3 volts.

Hence, when the voltage at input 48 is greater than the voltage at input 50, the output terminal 150 will be at a logical one. When the voltage at input 50 is greater than the voltage at input 48, the output terminal 150 will be at a logical zero.

The circuitry thus far described comprises the comparator portion of the three-state buffer 40. As can be seen from the foregoing, the voltages developed at input 68, the collectors of transistors 54 and 56 and the first and second inputs 126 and 128 of the threshold circuit 84 are all dependent upon the forward biased base to emitter voltage drops of the transistors and diodes. Also, the threshold voltage developed by threshold circuit 84 is dependent upon the forward biased base to emitter voltage drops of the transistors. As a result, the threshold voltage established by the threshold circuit 84 is always intermediate the first and second control voltages notwithstanding variations in integrated circuit processing parameters or integrated operating temperatures. Hence, there is always sufficient voltage at input 68 to assure that the threshold voltage developed by the threshold circuit 84 will be overcome. The three-state buffer 40 therefore includes a comparator which is capable of reliably determining which one of two voltages applied to its inputs 48 and 50 is the greater.

The three-state buffer 40 also includes an enable input 80. Enable input 80 is coupled to the base of a bipolar transistor 152 which has its collector coupled directly to the power source (VCC). Transistor 152 includes a dual emitter wherein one emitter is coupled to the first output 86 and the other emitter is coupled to the second output 88. When a disable voltage of sufficient magnitude is applied to the enable input 80, transistor 152 is turned on. This causes the inputs 126 and 128 of the threshold circuit 84 to be at a voltage level sufficient to overcome the threshold voltage established by the threshold circuit 84. As a result, resistors 106 and 108 will conduct to cause transistors 134 and 136 to turn off. As previously described, this presents a high impedance path between the output terminal 150 and ground potential.

In this condition, transistors 116 and 118 will also conduct. This causes transistors 130 and 132 to also be off. As a result, the output stage 46 is isolated from the output terminal 150 and to any circuitry external to the three-state buffer which may be coupled to the output terminal 150.

While a particular embodiment of the present invention has been shown and described, modifications may be made, and it is therefore intended to cover in the appended claims all such changes and modifications which fall within the true spirit and scope of the invention.

What is claimed is:

1. An integrated circuit comparator circuit for reliably determining which one of first and second input voltages to be compared is greater in potential notwithstanding variations in integrated circuit processing parameters or operating temperatures, said comparator circuit including a plurality of bipolar transistors, each said bipolar transistor having a collector, a base, and an emitter and a forward biased base to emitter voltage drop, said comparator circuit comprising:

control voltage generating means including a first plurality of said bipolar transistors for providing a first control voltage and a second control voltage, said first control voltage and said second control voltage having magnitudes dependent upon the forward biased base to emitter voltage drops of said first plurality of bipolar transistors, said first control voltage having a greater magnitude than said second control voltage;

threshold means including a second plurality of said bipolar transistors for establishing a threshold voltage intermediate said first and second control voltages, said threshold voltage being dependent upon the forward biased base to emitter voltage drops of said second plurality of bipolar transistors;

said control voltage generating means further including input means including first and second inputs for receiving said first and second input voltages to be compared respectively and for applying said first and second control voltages to said threshold means responsive to said input voltages to be compared; and output means responsive to said threshold means and said control voltage generating means for providing a first output when said first input voltage is greater than said second input voltage and a second output when said first input voltage is less than said second input voltage.

2. A comparator circuit as defined in claim 1 wherein said input means includes a differential input circuit for applying said first and second control voltages to said threshold means.

3. A comparator circuit as defined in claim 2 wherein said control voltage generating means further includes means for providing first and second level voltages greater in magnitude than said first and second control voltages and voltage shifting means coupled to said threshold means for shifting the levels of said first and second level voltages downward to provide said first and second control voltages.

4. A comparator circuit as defined in claim 3 wherein said voltage shifting means includes a plurality of said first plurality of bipolar transistors for shifting said first and second level voltages by an amount equal to a multiple number of forward biased base to emitter voltage drops.

5. A comparator circuit as defined in claim 1 wherein said threshold means comprises a first threshold circuit for receiving one of said first or second control voltages and a second threshold circuit for receiving the other one of said first or second control voltages and wherein said first and second threshold circuits each include means for providing said threshold voltage intermediate said first and second control voltages.

6. A comparator circuit as defined in claim 5 wherein said output means comprises a first output circuit coupled to said first threshold circuit and a second output circuit coupled to said second threshold circuit.

7. A comparator circuit as defined in claim 6 wherein said first and second output circuits are series coupled between a supply voltage and common potential and wherein said output means includes an output comprising the common junction of said first and second output circuits for providing said first and second outputs.

8. A comparator circuit as defined in claim 7 further including an enable input for receiving a disable voltage, said enable input being coupled to said first and second threshold circuits, said threshold circuits causing said first and second output circuits to provide a high impedance at said output in response to said disable voltage being applied to said enable input.

* * * * *